(12) United States Patent
Ma et al.

(10) Patent No.: US 12,013,240 B2
(45) Date of Patent: Jun. 18, 2024

(54) MEMS GYROSCOPE

(71) Applicant: AAC Kaitai Technologies (Wuhan) CO., LTD, Hubei (CN)

(72) Inventors: Zhao Ma, Shenzhen (CN); Zhan Zhan, Shenzhen (CN); Xiao Kan, Shenzhen (CN); Shan Yang, Shenzhen (CN); Shitao Yan, Shenzhen (CN); Hongtao Peng, Shenzhen (CN); Yang Li, Shenzhen (CN); Kahkeen Lai, Singapore (SG); Veronica Tan, Singapore (SG)

(73) Assignee: AAC KAITAI TECHNOLOGIES (WUHAN) CO., LTD, Wuhan (CN)

( * ) Notice: Subject to any disclaimer, the term of this patent is extended or adjusted under 35 U.S.C. 154(b) by 80 days.

(21) Appl. No.: 17/873,125

(22) Filed: Jul. 25, 2022

(65) Prior Publication Data

US 2023/0266124 A1 Aug. 24, 2023

(30) Foreign Application Priority Data

Feb. 22, 2022 (CN) .......................... 202210163479.5

(51) Int. Cl.
*G01C 19/5733* (2012.01)
*G01C 19/5769* (2012.01)

(52) U.S. Cl.
CPC ..... *G01C 19/5733* (2013.01); *G01C 19/5769* (2013.01); *B81B 2201/0242* (2013.01)

(58) Field of Classification Search
None
See application file for complete search history.

(56) References Cited

U.S. PATENT DOCUMENTS

| 2011/0094302 A1* | 4/2011 | Schofield | G01C 19/56 73/504.12 |
| 2012/0024056 A1* | 2/2012 | Hammer | G01C 19/5712 73/504.02 |
| 2012/0279301 A1* | 11/2012 | Gunthner | G01C 19/5719 73/504.12 |
| 2013/0167636 A1* | 7/2013 | Coronato | G01C 19/5712 73/504.12 |

(Continued)

*Primary Examiner* — Kristina M Deherrera
*Assistant Examiner* — Mark A Shabman
(74) *Attorney, Agent, or Firm* — W&G Law Group

(57) ABSTRACT

A MEMS gyroscope includes an anchor point unit, a sensing unit elastically connected with the anchor point unit, and a driving unit elastically connected with the anchor point unit and the sensing unit. The anchor point unit includes four corner anchor point structures arranged at four corners of the MEMS gyroscope and four central anchor points. The sensing unit includes four first mass blocks elastically connected with the corner anchor point structures and the central anchor points to form avoiding spaces, four second mass blocks arranged within the avoiding spaces, and four decoupling mass blocks. The driving unit includes four driving pieces respectively connected with outer sides of the second mass blocks. The MEMS gyroscope realizes independent detection of angular velocities of three axes and realizes differential detection and balance of vibration moment, which immune to influence of acceleration shock and quadrature error and improves detection accuracy.

10 Claims, 7 Drawing Sheets

(56) References Cited

U.S. PATENT DOCUMENTS

| | | | |
|---|---|---|---|
| 2013/0192365 A1* | 8/2013 | Zhuang | G01C 19/5733 |
| | | | 73/504.12 |
| 2014/0116135 A1* | 5/2014 | Cazzaniga | G01C 19/5747 |
| | | | 73/504.12 |
| 2015/0204897 A1* | 7/2015 | Yamamoto | G01P 15/123 |
| | | | 73/504.12 |
| 2018/0231384 A1* | 8/2018 | Johnson | G01C 19/5712 |
| 2018/0266821 A1* | 9/2018 | Zhang | G01C 19/5684 |
| 2018/0283867 A1* | 10/2018 | Ruohio | G01C 19/5747 |

* cited by examiner

MEMS GYROSCOPE

TECHNICAL FIELD

The present disclosure relates to a technical field of gyroscope, and in particular to a MEMS gyroscope

BACKGROUND

Micromachined gyroscope, also known as micro-electromechanical system (MEMS) gyroscope, is a typical miniature angular velocity sensor. Due to advantages of small size, low power consumption, and convenient processing, the MEMS gyroscopes have a very wide range of applications in the consumer electronics market. In recent years, with gradual improvement of performance of the MEMS gyroscopes, the MEMS gyroscopes are widely used in automotive, industrial, virtual reality and other fields.

US patent application publication U.S. Pat. No. 8,459, 110B2 (CN patent No. 102183246B) discloses an integrated MEMS gyroscope that comprises first driving mass blocks and second driving mass blocks. The first driving mass blocks and the second driving mass blocks respond to the angular velocity sensed by the integrated MEMS gyroscope to generate a sensing motion. Then the sensing motion is detected to obtain the angular velocity. The integrated MEMS gyroscope is able to realize three-axis detection. However, sense modes of the integrated MEMS gyroscope are coupled with each other, resulting in superposition of errors.

Therefore, it is necessary to improve the prior art and provide a MEMS gyroscope.

SUMMARY

Purpose of the present disclosure is to provide a micro-electro-mechanical system (MEMS) gyroscope to solve a problem of error superposition caused by coupling of sense modes of a three-axis detection MEMS gyroscope in the prior art.

The present disclosure provides a MEMS gyroscope. The MEMS gyroscope comprises an anchor point unit, a sensing unit elastically connected with the anchor point unit, and a driving unit elastically connected with the anchor point unit and the sensing unit.

The MEMS gyroscope is in a shape of a rectangle. The anchor point unit comprises four corner anchor point structures arranged at four corners of the MEMS gyroscope and four central anchor points arranged in the MEMS gyroscope and spaced from the four corner anchor point structures.

The sensing unit comprises four first mass blocks, four second mass blocks, and four decoupling mass blocks. Each of the four first mass blocks is elastically connected with a corresponding corner anchor point structure and a corresponding central anchor point and avoiding spaces are formed among the four first mass blocks, the four corner anchor point structures and the central anchor points. Each of the four second mass blocks is arranged in a corresponding avoiding space. Each of the four decoupling mass blocks is arranged in a corresponding avoiding space and is elastically connected with a corresponding second mass block. The four first mass blocks, the four second mass blocks and the four decoupling mass blocks are arranged within the MEMS gyroscope. Each of the decoupling mass blocks is arranged opposite to an inner side of the corresponding second mass block. Each two adjacent decoupling mass blocks are elastically connected with each other'

The driving unit comprises four driving pieces. Each of the driving pieces is connected with an outer side of a corresponding second mass block. Two ends of each of the driving pieces are elastically connected with adjacent corner anchor point structures.

Furthermore, each of the corner anchor point structures comprises a corner anchor point arranged at one corner of the four corners of the MEMS gyroscope, a coupling ring elastically connected with the corner anchor point, and a driving anchor point. Each driving anchor point is arranged between each two adjacent corner anchor points and is close to a corresponding driving piece. An outer side of each coupling ring extends to form a first flexible beam and a first connecting beam. Each first flexible beam is connected with a corresponding first mass block. Each first connecting beam is connected with a corresponding driving piece. Each of the driving pieces extends to form first guiding beams connected with corresponding driving anchor points.

Furthermore, each of the corner anchor points includes a plurality of sub-anchor points. Each coupling ring is sleeved on the plurality of sub-anchor points of a corresponding corner anchor point. An inner side of each coupling ring extends toward the plurality of sub-anchor points of the corresponding corner anchor point to form first coupling beams connecting the plurality of sub-anchor points of the corresponding corner anchor point.

Furthermore, each first flexible beam comprises a first body extending from a corresponding coupling ring toward a corresponding first mass block and a first elastic beam connecting the first body and the corresponding first mass block.

Furthermore, each first connecting beam comprises a first connecting body extending from a corresponding coupling ring toward a corresponding driving piece and a first elastic connecting beam connecting the first connecting body and the corresponding driving piece.

Furthermore, one side of each of the first mass blocks close to the corresponding central anchor point extends to form a second flexible beam connected with the corresponding central anchor point.

Furthermore, each of the second mass blocks extends to form second guiding beams connected with a corresponding driving piece.

Furthermore, a second elastic beam is arranged on one side of each of the decoupling mass blocks close to the corresponding second mass block. Each second elastic beam is connected with one side of a corresponding second mass block. A middle portion of each second elastic beam is bent along a gap between the corresponding decoupling mass block and the corresponding second mass block.

Furthermore, the anchor point unit further comprises first guiding beam anchor point close to the decoupling mass blocks. Each of the decoupling mass blocks extends to form third guiding beams. Each of the third guiding beams is connected with a corresponding first guiding beam anchor point.

Furthermore, one end of each of the decoupling mass blocks away from the corresponding second mass block extends to form second coupling beams connected with adjacent decoupling mass blocks.

Furthermore, the MEMS gyroscope further comprises first transducers coupled with the driving unit and second transducers coupled with the sensing unit. The first transducers are arranged one-to-one corresponding to the driving pieces. The second transducers is arranged one-to-one corresponding to the first mass blocks and the decoupling mass blocks.

Furthermore, the first transducers comprise any one or a combination of capacitive transducers, inductive transducers, pyroelectric transducers, and piezoelectric transducers. The second transducers comprise any one or a combination of the capacitive transducers, the inductive transducers, the pyroelectric transducers, and the piezoelectric transducers.

The principle of the present disclosure is as follow:

In a drive mode, the driving unit is linked to the first mass blocks through the corner anchor point structures. The driving unit drives the first mass blocks to move in a 0°/90° direction in a plane where the first mass blocks are located, while the driving unit drives the second mass blocks to move in a 45°/135° direction in the plane. Moving directions of the four first mass blocks and moving directions of the four second mass blocks respectively form differential modes.

In a sense mode, the first mass blocks respond to the angular velocities in two directions in the plane. When the external angular velocity ω received by the MEMS gyroscope is located in the plane and is perpendicular to the moving directions of the first mass blocks, according to the Coriolis principle, the angular velocity ω generate out-of-plane Coriolis force in a orthogonal direction. The Coriolis force forces the first mass blocks to swing out of the plane. Among the first mass blocks: two first mass blocks arranged along the 0° direction respond to the angular velocity ω along the 90° direction, and because the two first mass blocks arranged at 0° direction move in opposite directions in the drive mode, swing directions of the two first mass blocks arranged along the 0° direction in the sense mode are opposite to each other, forming differential detection. Similarly, the two first mass blocks arranged along the 90° direction respond to the angular velocity ω along the 0° direction, and form the differential detection in the sense mode.

The second mass blocks respond to the angular velocities orthogonal to the in-plane direction. When the direction of the angular velocity ω that the MEMS gyroscope is subjected to is orthogonal to the in-plane direction, according to the Coriolis principle, the angular velocity ω generates the in-plane Coriolis force perpendicular to the moving directions of the second mass blocks. The in-plane Coriolis force forces the second mass blocks to move along a moving direction perpendicular to the in-plane Coriolis force. Among the second mass blocks, two second mass blocks arranged along the 45° direction move in opposite directions in the sense mode, and two second mass blocks arranged along the 135° direction move in opposite directions in the sense mode, so the four second mass blocks form differential detection in the sense mode.

In the MEMS gyroscope of the present disclosure, the mass blocks for sensing are symmetrically arranged, which realize the differential detection. In the drive mode, the MEMS gyroscope is differential driven, which effectively improve stability of the MEMS gyroscope. Three-axis sense modes of the MEMS gyroscope realize anti-phase vibration, so the differential detection of the MEMS gyroscope is realized and a vibration moment is balanced, which effectively immune to the influence of acceleration shock and orthogonal error. The mass blocks are elastically connected with the anchor point unit through decoupling structures, which effectively reduces the coupling between different sense modes of the mass blocks, avoids interference of motions in different modes, reduces displacements of non-moving mass blocks, reduces quadrature error, and is beneficial to bias stability of the sensor. The mass blocks are elastically connected with the mass blocks through the decoupling structures to realize the anti-phase motion between different mass blocks, which effectively forms the differential detection. The angular velocities applied to three axes of the MEMS gyroscope are independently detected, which effectively avoids the coupling of detection errors of different axes and improves detection accuracy of the MEMS gyroscope.

DETAILED DESCRIPTION

The present disclosure will be further described below with reference to the accompanying drawings and embodiments.

Figure 1:
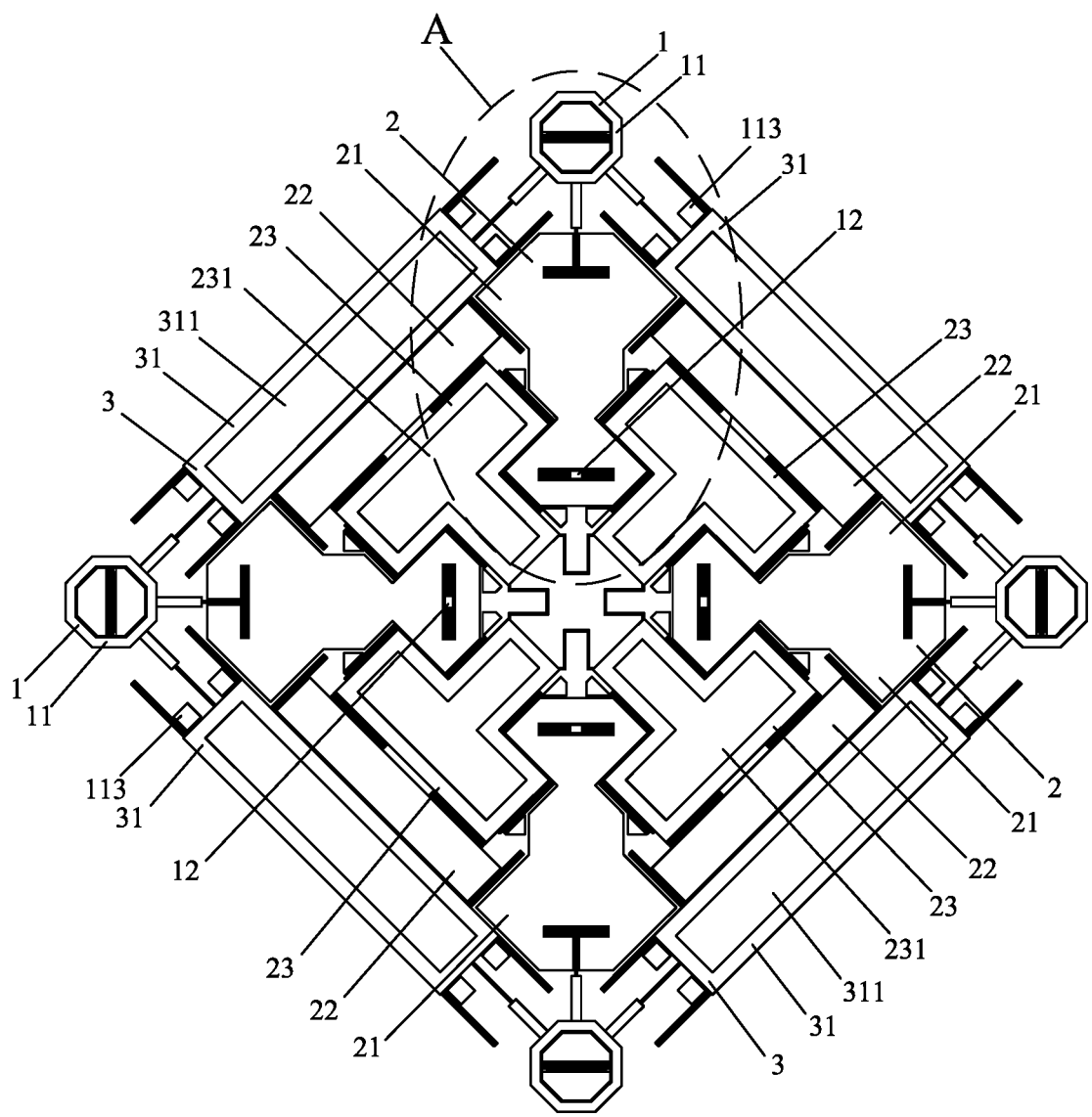
FIG. 1 is a top plan schematic diagram of a MEMS gyroscope according to one embodiment of the present disclosure.

As shown in FIG. 1, in one embodiment, the present disclosure provides a MEMS gyroscope. The MEMS gyroscope comprises an anchor point unit 1, a sensing unit 2 elastically connected with the anchor point unit 1, and a driving unit 3 elastically connected with anchor point unit 1 and the sensing unit 2.

The MEMS gyroscope is in a shape of a rectangle. The anchor point unit 1 comprises four corner anchor point structures 11 arranged at four corners of the MEMS gyroscope and four central anchor points 12 arranged in the MEMS gyroscope and spaced from the four corner anchor point structures 11.

The sensing unit 2 comprises four first mass blocks 21, four second mass blocks 22, and four decoupling mass blocks 23. Each of the first mass blocks 21 is elastically connected with a corresponding corner anchor point structure 11 and a corresponding central anchor point 12 and avoiding spaces are formed among the four first mass blocks 21, the four corner anchor point structures 11 and the central anchor points 12. Each of the second mass blocks 22 is arranged in a corresponding avoiding space. Each of the decoupling mass blocks 23 is arranged in a corresponding avoiding space and is elastically connected with a corresponding second mass block 22. The four first mass blocks 21, the four second mass blocks 22, and the four decoupling mass blocks 23 are arranged within the MEMS gyroscope. Each of the decoupling mass blocks 23 is arranged opposite to an inner side of the corresponding second mass block 22. Each two adjacent decoupling mass blocks 23 are elastically connected with each other'

The driving unit 3 comprises four driving pieces 31. Each of the driving pieces 31 is connected with an outer side of a corresponding second mass block 22. Two ends of each of the driving pieces 31 are elastically connected with adjacent corner anchor point structures 11.

Figure 2:
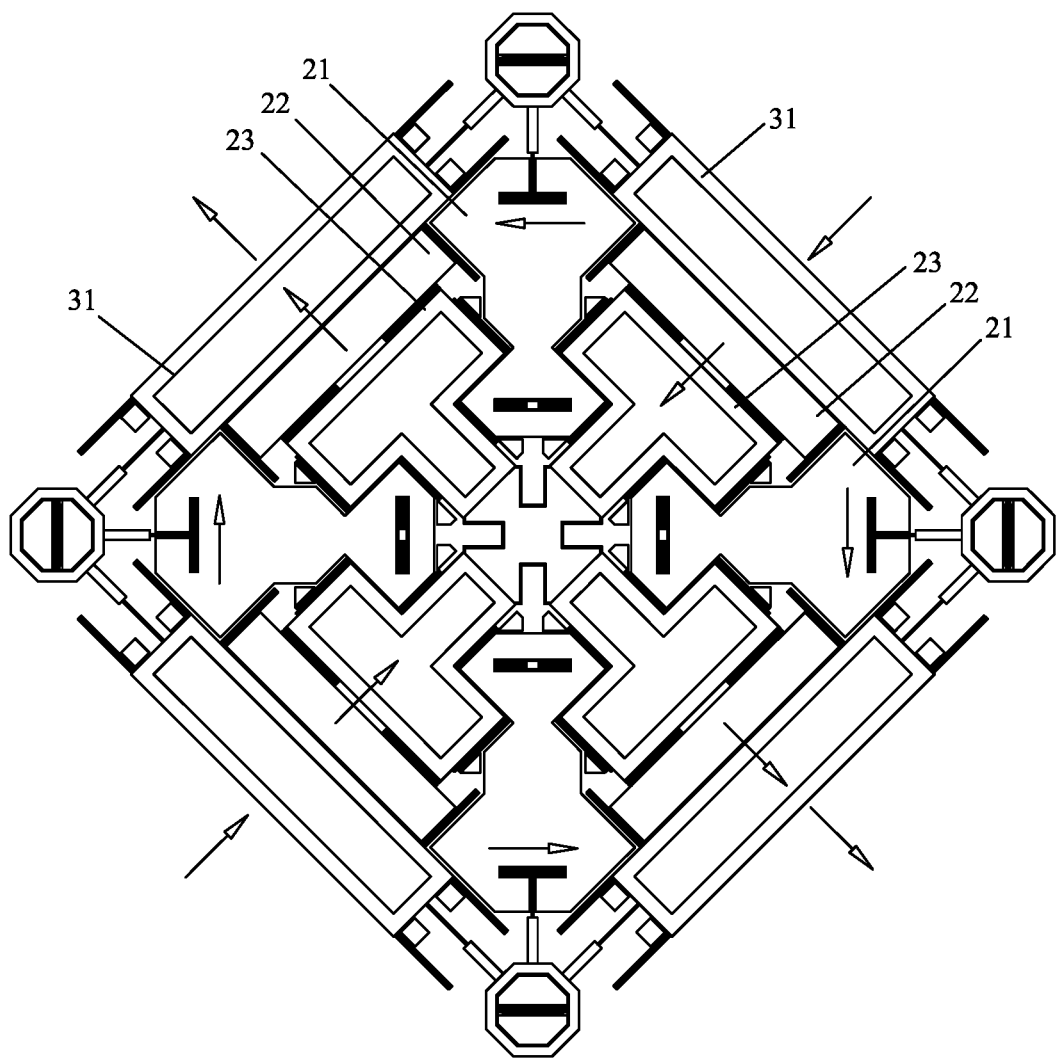
FIG. 2 is a schematic diagram of the MEMS gyroscope shown in a drive mode according to one embodiment of the present disclosure.
Figure 3:
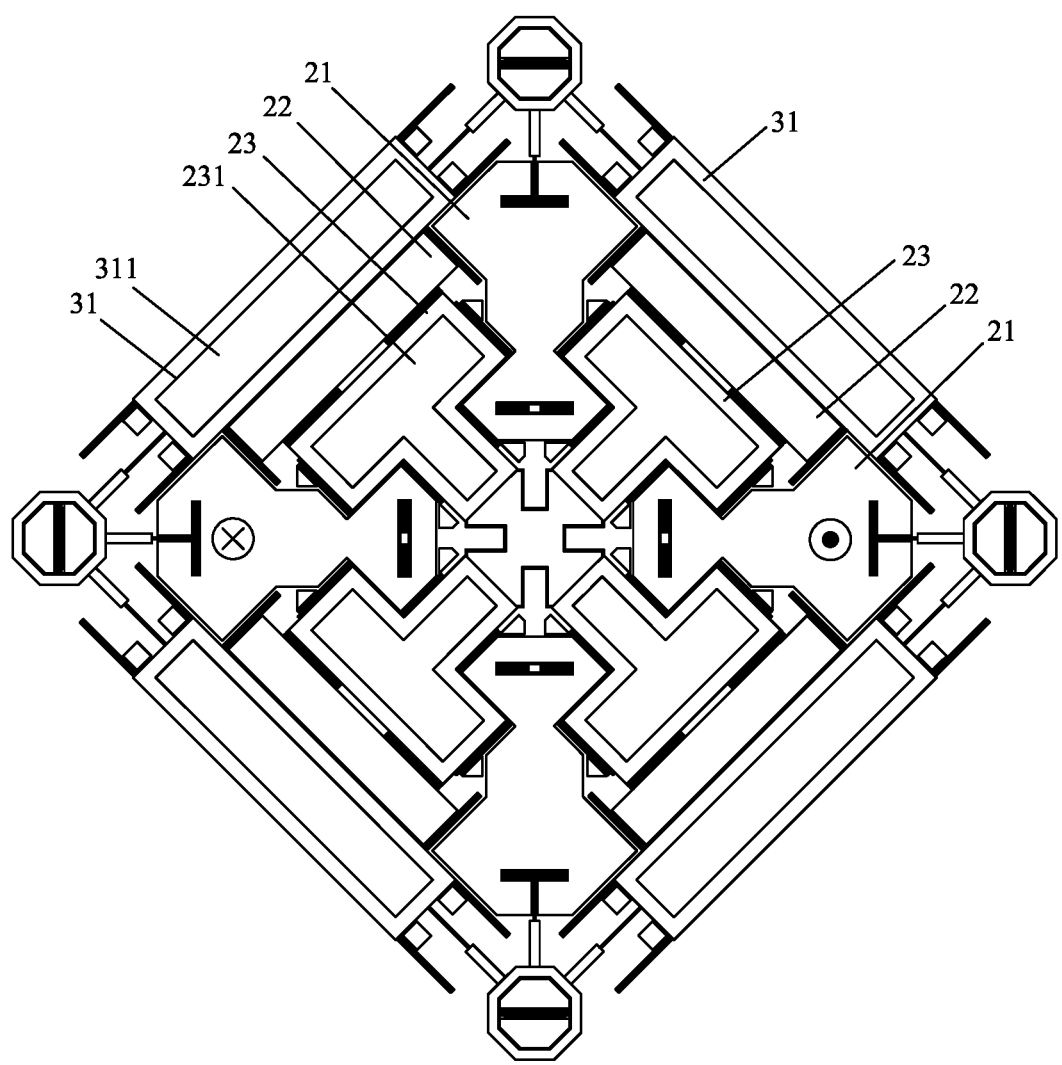
FIG. 3 is a schematic diagram of the MEMS gyroscope shown in an X-axis sense mode according to one embodiment of the present disclosure.
Figure 4:
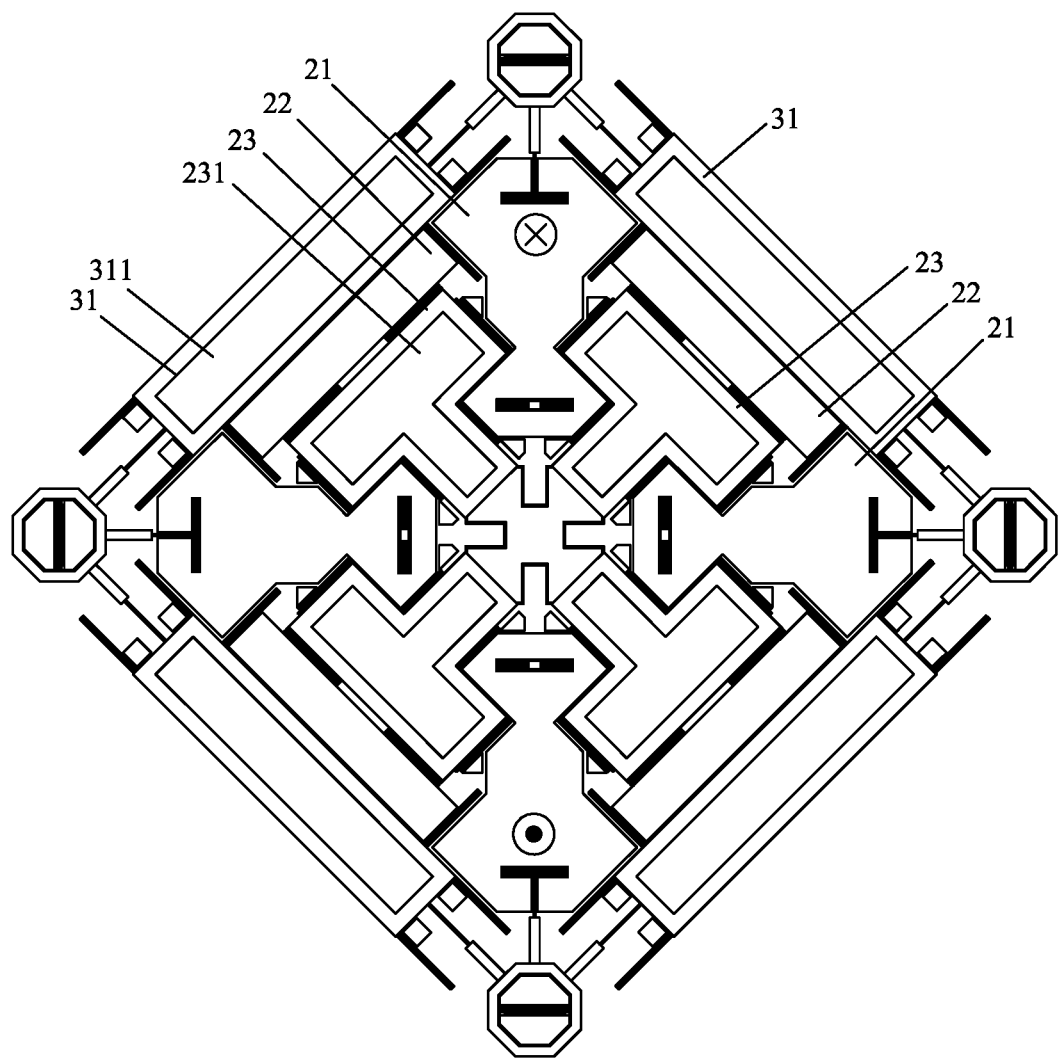
FIG. 4 is a schematic diagram of the MEMS gyroscope shown in a Y-axis sense mode according to one embodiment of the present disclosure.
Figure 5:
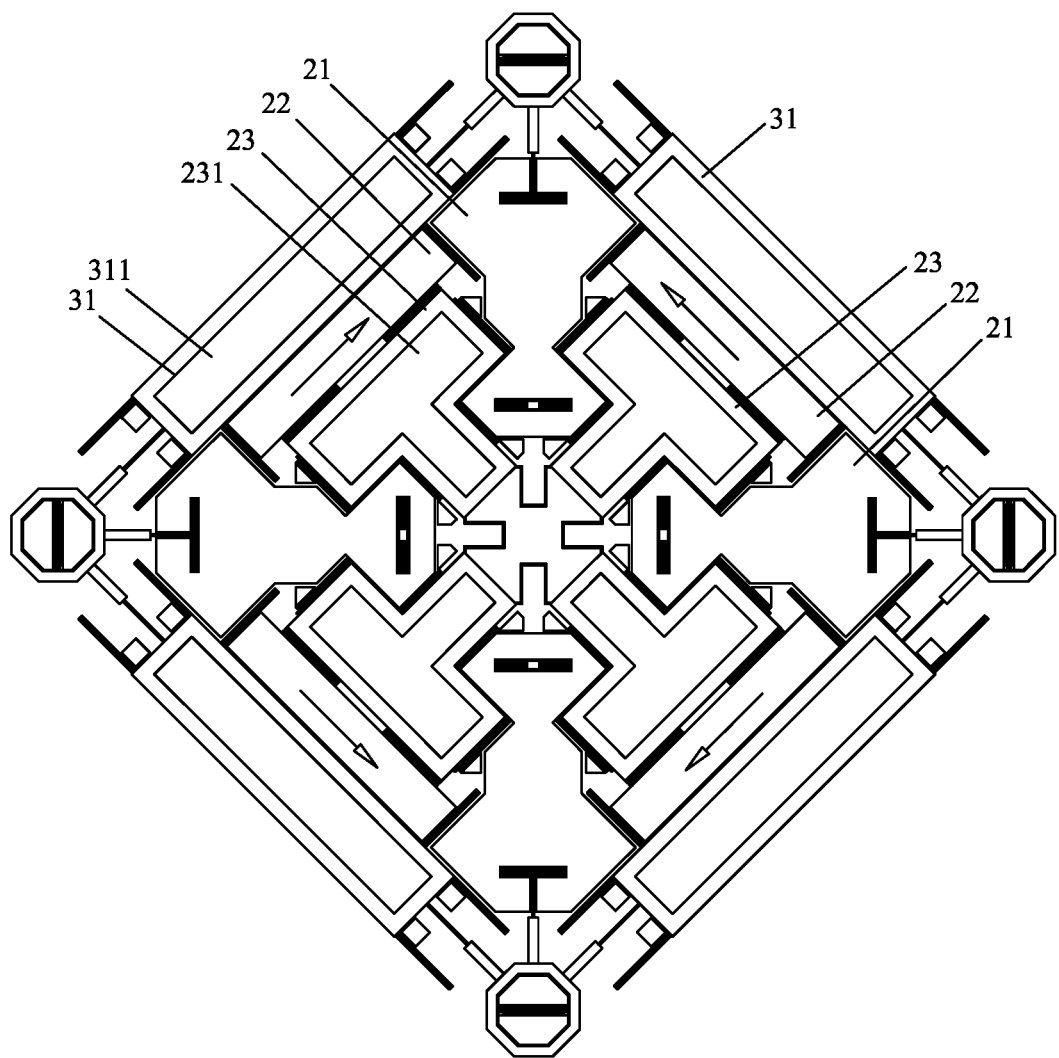
FIG. 5 is a schematic diagram of the MEMS gyroscope shown in a Z-axis sense mode according to one embodiment of the present disclosure.

In the embodiment, when the MEMS gyroscope is in a drive mode, as shown in FIG. 2, the driving pieces 31 are linked to the first mass blocks 21 through the corner anchor point structures 11. The driving pieces 31 drive the first mass blocks 21 to move in a 0°/90° direction in a plane where the first mass blocks are located, while the driving pieces drive the second mass blocks 22 to move in a 45°/135° direction in the plane. Moving directions of the four first mass blocks 21 and moving directions of the four second mass blocks 22 respectively form differential modes.

When the MEMS gyroscope is in a sense mode, the first mass blocks 21 respond to the angular velocities in two directions in the plane. When the external angular velocity ω received by the MEMS gyroscope is located in the plane and is perpendicular to the moving directions of the first mass blocks 21, according to the Coriolis principle, the angular velocity ω generate out-of-plane Coriolis force in a orthogonal direction. The out-of-plane Coriolis force forces the first mass blocks 21 to swing out of the plane where the first mass blocks are located. Among the first mass blocks 21, two first mass blocks arranged along the 0° direction respond to the angular velocity ω along the 90° direction, and because the two first mass blocks arranged at 0° direction move in opposite directions in the drive mode, swing directions of the two first mass blocks 21 arranged along the 0° direction in the sense mode are opposite to each other, forming differential detection. Similarly, the two first mass blocks 21 arranged along the 90° direction respond to the angular velocity ω along the 0° direction, and form the differential detection in the sense mode.

The second mass blocks 22 respond to the angular velocities orthogonal to the in-plane direction. When the direction of the angular velocity ω that the MEMS gyroscope is subjected to is orthogonal to the in-plane direction, according to the Coriolis principle, the angular velocity ω generates the in-plane Coriolis force perpendicular to the moving directions of the second mass blocks. The in-plane Coriolis force forces the second mass blocks 22 to move along a moving direction perpendicular to the in-plane Coriolis force. Among the second mass blocks 22, two second mass blocks 22 arranged along the 45° direction move in opposite directions in the sense mode, and two second mass blocks 22 arranged along the 135° direction move in opposite directions in the sense mode, so the four second mass blocks 22 form differential detection in the sense mode.

Figure 6:
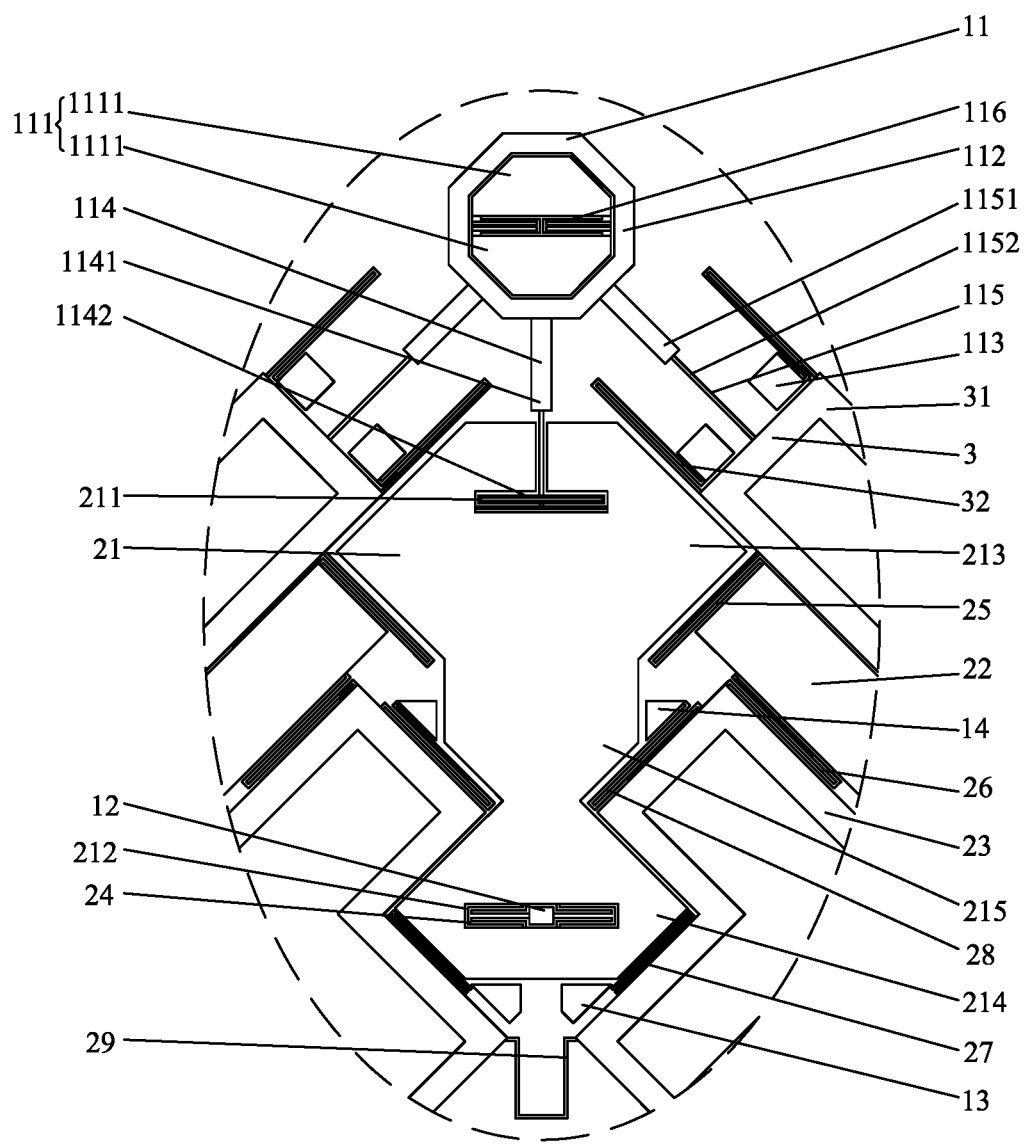
FIG. 6 is an enlarged view of portion A shown in FIG. 1.

As shown in FIG. 6, each of the corner anchor point structures 11 comprises a corner anchor point 111 arranged at a corresponding corner of the four corners of the MEMS gyroscope, a coupling ring 112 elastically connected with the corner anchor point 111, and a driving anchor point 113. Each driving anchor point 113 is arranged between each two adjacent corner anchor points 111 and is close to a corresponding driving piece 31. An outer side of each coupling ring 112 extends to form a first flexible beam 114 and a first connecting beam 115. Each first flexible beam 114 is connected with a corresponding first mass block 21. Each first connecting beam 115 is connected with a corresponding driving piece 31. Each of the driving pieces 31 extends to form first guiding beams 32 connected with corresponding driving anchor points 113.

Specifically, two ends of each of the driving piece 31 extend outward to form the first guiding beams 32. A middle portion of each of the first guiding beams 32 is bent and extended in a direction away from the corresponding driving piece 31. In the embodiment, the first guiding beams 32 guide moving directions of the driving pieces 31, so that the driving pieces 31 move in a 45°/135° direction. Through the corner anchor point structures 11, the driving pieces 31 and the first mass blocks 21 are linked with each other to drive the first mass blocks 21 to move in the plane.

Each of the corner anchor points 111 includes a plurality of sub-anchor points 1111. Each coupling ring 112 is sleeved on the plurality of sub-anchor points 1111 of a corresponding corner anchor point 111. An inner side of each coupling ring 112 extends toward the plurality of sub-anchor points 1111 of the corresponding corner anchor point 111 to form first coupling beams 116 connecting the plurality of sub-anchor points 1111 of the corresponding corner anchor point 111. Specifically, as shown in FIG. 6, each of the corner anchor points 111 comprises two sub-anchor points 1111 arranged at intervals. The coupling ring 112 is sleeved on outer sides of the two sub-anchor points 1111. The inner side of each coupling ring 112 extends toward an interval between the two sub-anchor points 1111 to form first coupling beams 116 connected with the two sub-anchor point 1111 of the corresponding corner anchor point 111. Through the first coupling beams 116, each coupling ring 112 has degrees of freedom of in-plane rotation and out-of-plane swing.

As shown in FIG. 6, each first flexible beam 114 comprises a first body 1141 extending from a corresponding coupling ring 112 toward a corresponding first mass block 21 and a first elastic beam 1142 connecting the first body 1141 and the corresponding first mass block 21.

Specifically, a first connecting gap 211 is defined on one side of each of the first mass blocks 21 close to the corresponding coupling ring 112. Each first elastic beam 1142 extends from one end of a corresponding first body 1141 away from the corresponding coupling ring 112 into a corresponding first connecting gap 11 and is connected with a corresponding first mass block 21. Each first connecting beam 115 comprises a first connecting body 1151 extending from the corresponding coupling ring 112 toward the corresponding driving piece 31 and a first elastic connecting beam 1152 connecting the first connecting body 1151 and the corresponding driving piece 31. Specifically, each first elastic connecting beam 1152 extends from one end of a corresponding first connection body 1151 away from each coupling ring 112 and is connected with the corresponding driving piece 31. Through above structures, in the drive mode, the first mass blocks 21 are coupled with the driving pieces 31. Since each first elastic beam 1142 has high rigidity along the 0°/90° direction, in the drive mode, the first mass blocks 21 move in the 0°/90° direction in the plane. Further, since the first elastic beams 1142 and the first coupling beam s116 have low rigidity in the out-of-plane direction, so the first mass blocks 21 have freedom to swing out of the plane.

As shown in FIG. 6, one side of each of the first mass blocks 21 close to the corresponding central anchor point 12 extends to form a second flexible beam 24 connected with the corresponding central anchor point 12.

Specifically, a second connecting gap 212 is defined on one side of each of the first mass blocks 21 close to the corresponding central anchor point 12. Each of first mass blocks 21 extends in the second connecting gap 212 to form a second flexible beam 24 connected with the corresponding central anchor point 12. Each second flexible beam 24 is bent toward a length direction of a corresponding second connecting gap 212 to form a flexible structure.

Each of the second mass blocks 22 extends to form second guiding beams 25 connected with a corresponding driving piece 31.

Specifically, as shown in FIG. 6, two sides of a portion of each of the first mass blocks 21 close to the corresponding corner anchor point structure 11 respectively extend toward the corresponding driving piece 31 to form first extending portions 213. Each of the second mass blocks 22 is arranged between each two adjacent first extending portions 213. Two ends of each of the second mass blocks 22 extends to from the second guiding beams 25. A middle portion of each of the second guiding beams 25 is bent in a direction away from the corresponding driving piece 31.

Since the second guiding beams 25 have high rigidity along the 45°/135° direction, in the drive mode, each of the second mass blocks 22 is coupled with the corresponding driving piece 31, the driving pieces 31 drive the second mass blocks 22 to move in the 45°/135° direction. Meanwhile, the second guiding beams 25 have low rigidity in the direction perpendicular to 45°/135°, so the second mass blocks 22 have freedom to move along a direction perpendicular to the 45°/135° direction.

As shown in FIG. 6, two sides of a portion of each of the first mass blocks 21 close to the corresponding central anchor point 12 extend outward to form second extending portions 214. Each of the decoupling mass blocks 23 is arranged between each two adjacent second extending portions 214.

A second elastic beam 26 is arranged on one side of each of the decoupling mass blocks 23 close to the corresponding second mass block 22. Each second elastic beam 26 is connected with one side of a corresponding second mass block 22. Specifically, a middle portion of each second elastic beam 26 is bent along a gap between the corresponding decoupling mass block 23 and the corresponding second mass block 22. The anchor point unit 1 further comprises first guiding beam anchor points 13 close to the decoupling mass blocks 23. Each of the decoupling mass blocks 23 extends to form third guiding beams 27. Each of the third guiding beams 27 is connected with a corresponding first guiding beam anchor point 13. Specifically, as shown in FIG. 6, each of the first guiding beam anchor points 13 is arranged between each of the decoupling mass blocks 23 and a corresponding second extending portion 214. One side of each of the decoupling mass block 23 close to the corresponding second extending portion 214 extends to form the third guiding beam 27. A middle portion of each of the third guiding beams 27 is bent along a gap between the corresponding second extending portion 214 and the corresponding decoupling mass block 23. The rigidity of the second elastic beams 26 is low in the 45°/135° direction, and the rigidity of the second elastic beams 26 is high in the direction perpendicular to the 45°/135° direction. The rigidity of the third guiding beams 27 is large in the 45°/135° direction, and the rigidity of the third guiding beams 27 is small in the direction perpendicular to the 45°/135° direction, so in the drive mode, the decoupling mass blocks 23 and the second mass blocks 22 are move to decouple, and in the sense mode, each of the decoupling mass blocks 23 is coupled with the corresponding second mass block 22.

As shown in FIG. 6, in the embodiment, two sides of a middle portion of each of the first mass blocks 21 extend toward the corresponding decoupling mass block 23 to form third extending portions 215. The anchor point unit 1 further comprises second guiding beam anchor points 14. Each of the second guiding beam anchor points is arranged between a corresponding third extending portion 215 and a corresponding decoupling mass block 23. A fourth guiding beam connected with a corresponding second guiding beam anchor point 14 is arranged on one side of each of the decoupling mass blocks 23 close to the corresponding third extending portion 215. A middle portion of the fourth guiding beam 28 is bent along a gap between the corresponding third extending portion 215 and the corresponding decoupling mass 23.

The rigidity of the fourth guiding beams 28 is large in the 45°/135° direction, and the rigidity of the fourth guiding beams 28 is small in the direction perpendicular to the 45°/135° direction. The fourth guiding beams 28 realize the same function as the third guiding beams 27, therefore, in some embodiments, the fourth guiding beams 28 may not be provided.

As shown in FIG. 6, one end of each of the decoupling mass blocks 23 away from the corresponding second mass block 22 extends to form second coupling beams 29 connected with adjacent decoupling mass blocks 23, so the adjacent decoupling mass blocks 23 are coupled with each other.

Figure 7:
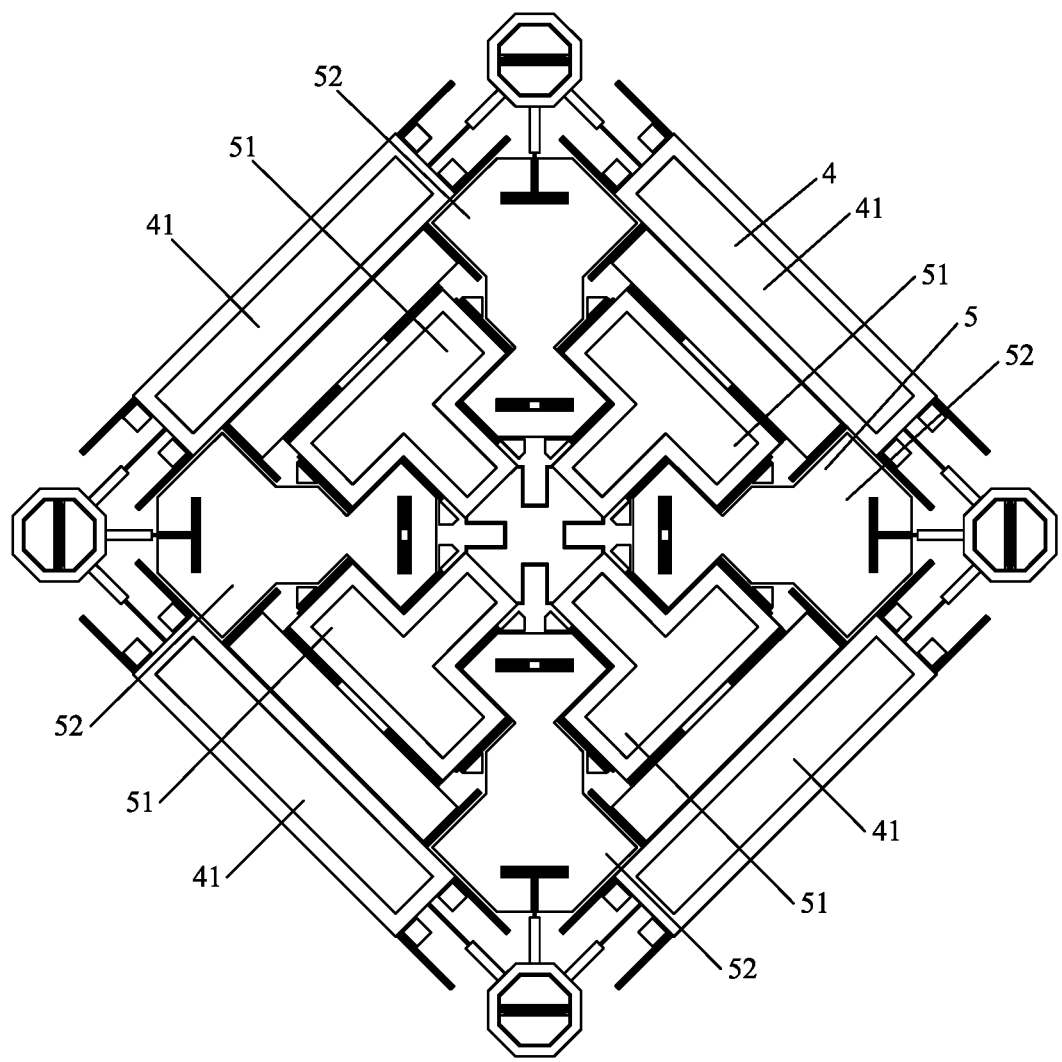
FIG. 7 is a schematic diagram showing arrangements of first transducers and second transducers of the MEMS gyroscope according to one embodiment of the present disclosure.

As shown in FIG. 7, in the embodiment, the MEMS gyroscope further comprises first transducers 4 coupled with the driving unit and second transducers 5 coupled with the sensing unit. The first transducers 4 comprise any one or a combination of capacitive transducers, inductive transducers, pyroelectric transducers, and piezoelectric transducers. The second transducers 5 comprise any one or a combination of the capacitive transducers, the inductive transducers, the pyroelectric transducers, and the piezoelectric transducers.

In the embodiment, a first cavity 311 is defined inside each of the driving pieces 31, and the first transducers 4 comprise four in-plane driving electrodes 41 respectively arranged in the first cavities 311 of the four driving piece 31. In the embodiment, a second cavity 231 is defined inside each of the decoupling mass blocks 23, and the second transducers 5 comprise four in-plane detecting electrodes 51 respectively arranged in the second cavities 231 of the four decoupling mass blocks 23 and the four out-of-plane detecting electrodes 52 arranged out of the plane and respectively arranged above or below the four first mass blocks 21.

The above are only embodiments of the present disclosure. It should be pointed out that for those of ordinary skill in the art, improvements can be made without departing from the inventive concept of the present disclosure, which should all fall within the protection scope of the present disclosure.

What is claimed is:

1. A micro-electro-mechanical system (MEMS) gyroscope, comprising:
   an anchor point unit;
   a sensing unit elastically connected with the anchor point unit; and
   a driving unit elastically connected with the anchor point unit and the sensing unit;
   wherein the MEMS gyroscope is in a shape of a rectangle; the anchor point unit comprises four corner anchor point structures arranged at four corners of the MEMS gyroscope and four central anchor points arranged in the MEMS gyroscope and spaced from the four corner anchor point structures;
   wherein the sensing unit comprises four first mass blocks, four second mass blocks, and four decoupling mass blocks; each of the four first mass blocks is elastically connected with a corresponding corner anchor point structure and a corresponding central anchor point, and avoiding spaces are formed among the four first mass blocks, the four corner anchor point structures and the central anchor points; each of the four second mass blocks is arranged in the corresponding avoiding space; each of the four decoupling mass blocks is arranged in the corresponding avoiding space and is elastically connected with a corresponding second mass block; the four first mass blocks, the four second mass blocks and the four decoupling mass blocks are arranged within the MEMS gyroscope; each of the decoupling mass blocks is arranged on a side of the corresponding second mass block facing the center of the MEMS gyroscope; one decoupling mass block corresponds to one edge of the rectangle, and each decoupling mass block is elastically connected to two decoupling mass blocks located on both sides;

wherein the driving unit comprises four driving pieces; each of the driving pieces is connected to a corresponding second mass block on a side away from the center of the MEMS gyroscope; and two ends of each of the driving pieces are elastically connected with adjacent corner anchor point structures.

2. The MEMS gyroscope according to claim 1, wherein each of the corner anchor point structures comprises a corner anchor point arranged at a corresponding corner of the four corners of the MEMS gyroscope, a coupling ring elastically connected with the corner anchor point, and a driving anchor point; each driving anchor point is arranged between one corner anchor point and one driving piece, and is connected to the corresponding driving piece; an outer side of each coupling ring extends to form one first flexible beam and two first connecting beams; each first flexible beam is connected with a corresponding first mass block; two first connecting beams are located on either side of the first flexible beam and are respectively connected to one driving piece; each of the driving pieces extends to form first guiding beams connected with corresponding driving anchor points.

3. The MEMS gyroscope according to claim 2, wherein each of the corner anchor points includes a plurality of sub-anchor points; each coupling ring is sleeved on the plurality of sub-anchor points of a corresponding corner anchor point; an inner side of each coupling ring extends toward the plurality of sub-anchor points of the corresponding corner anchor point to form first coupling beams connecting the plurality of sub-anchor points of the corresponding corner anchor point.

4. The MEMS gyroscope according to claim 3, wherein the MEMS gyroscope also comprises second coupling beams, one second coupling beam is arranged between every two decoupling mass blocks, and each second coupling beam connects two adjacent decoupling mass blocks.

5. The MEMS gyroscope according to claim 2, wherein each first flexible beam comprises a first body extending from a corresponding coupling ring toward a corresponding first mass block and a first elastic beam connecting the first body and the corresponding first mass block.

6. The MEMS gyroscope according to claim 2, wherein each first connecting beam comprises a first connecting body extending from a corresponding coupling ring toward a corresponding driving piece and a first elastic connecting beam connecting the first connecting body and the corresponding driving piece.

7. The MEMS gyroscope according to claim 1, wherein each of the first mass blocks close to the corresponding central anchor point extends to form a second flexible beam connected with the corresponding central anchor point.

8. The MEMS gyroscope according to claim 1, wherein each of the second mass blocks extends to form second guiding beams connected with a corresponding driving piece.

9. The MEMS gyroscope according to claim 1, wherein a second elastic beam is arranged between each of the decoupling mass blocks and the corresponding second mass block; each second elastic beam is connected with one side of a corresponding second mass block.

10. The MEMS gyroscope according to claim 1, wherein the anchor point unit further comprises first guiding beam anchor points arranged between the first mass blocks and the decoupling mass blocks; each of the decoupling mass blocks extends to form third guiding beams; each of the third guiding beams is connected with a corresponding first guiding beam anchor point.

* * * * *